(12) United States Patent
Dick

(10) Patent No.: US 7,135,127 B2
(45) Date of Patent: *Nov. 14, 2006

(54) LAMINATED PRESSED ARTICLES

(75) Inventor: Stefan O. Dick, Albuquerque, NM (US)

(73) Assignee: Süd-Chemie AG, München (DE)

( * ) Notice: Subject to any disclaimer, the term of this patent is extended or adjusted under 35 U.S.C. 154(b) by 444 days.

This patent is subject to a terminal disclaimer.

(21) Appl. No.: 10/149,349

(22) PCT Filed: Dec. 12, 2000

(86) PCT No.: PCT/EP00/12604

§ 371 (c)(1),
(2), (4) Date: Oct. 15, 2002

(87) PCT Pub. No.: WO01/44107

PCT Pub. Date: Jun. 21, 2001

(65) Prior Publication Data

US 2003/0064888 A1 Apr. 3, 2003

Related U.S. Application Data

(63) Continuation-in-part of application No. 10/040,794, filed on Jan. 7, 2002.

(60) Provisional application No. 60/260,282, filed on Jan. 8, 2001.

(30) Foreign Application Priority Data

Dec. 13, 1999 (DE) ................................ 199 59 957

(51) Int. Cl.
*H01J 7/18* (2006.01)
(52) U.S. Cl. ............................ 252/181.1; 252/181.6; 252/189; 252/192

(58) Field of Classification Search ............ 252/181.1, 252/181.6, 189, 192
See application file for complete search history.

(56) References Cited

U.S. PATENT DOCUMENTS

| 4,146,277 A | 3/1979 | Santoro |
| 4,360,444 A | 11/1982 | Esterl et al. |
| 4,963,788 A | 10/1990 | King et al. |
| 5,591,379 A | 1/1997 | Shores |
| 5,882,761 A | 3/1999 | Kawami et al. |

FOREIGN PATENT DOCUMENTS

| DE | 3711156 | 10/1988 |
| EP | 0604860 | 7/1994 |
| JP | 46032572 | 9/1971 |
| JP | 55104913 | 8/1980 |
| JP | 55165144 | 12/1980 |
| JP | 56063818 | 5/1981 |
| JP | 60129139 | 7/1985 |
| JP | 60132643 | 7/1985 |
| JP | 61155216 | 7/1986 |
| JP | 63218234 | 9/1988 |
| JP | 2144121 | 6/1990 |
| JP | 06 039235 | 1/1994 |
| JP | 0716 140 | 6/1996 |
| WO | WO 01/44107 | 6/2001 |

OTHER PUBLICATIONS

U.S. Appl. No. 10/040,794, filed Jan. 7, 2002, Dick et al.

*Primary Examiner*—Edward J. Cain
(74) *Attorney, Agent, or Firm*—Scott R. Cox

(57) ABSTRACT

A disk-shaped wafer is described which is based on an inorganic sorbent and a binder, with a thickness of less than 700 microns, which can be obtained by pressing a mixture of the inorganic sorbent, about 20 to 60% by weight of the binder and about 10 to 15% by weight water at a pressure of at least 70 MPa; and calcining the resulting green wafer at temperatures of at least about 500° C. until the water content is substantially removed.

23 Claims, 1 Drawing Sheet

LAMINATED PRESSED ARTICLES

RELATED ART

This application is a continuation-in-part application of U.S. patent application Ser. No. 10/040,794, filed on Jan. 7, 2002, which claims priority from Provisional Patent Application No. 60/260,282, filed on Jan. 8, 2001.

FIELD OF INVENTION

The invention relates to disk-shaped wafers prepared from an inorganic sorbent and a binder, with a thickness of less than 700 microns, which are characterized by high mechanical strength and low brittleness and which are able to effectively sorb inorganic and organic gases or vapors.

BACKGROUND OF INVENTION

The production of wafers, especially tablets, based on zeolites and binders is already known. Thus, according to JP-A-61 15 5216, zeolite tablets are produced by mixing a zeolite, a binder and a lubricant and extruding the mixture. They are formed as tablets with the same dimensions in all directions.

JP-A-56063818 discloses production of zeolite tablets for use as gas adsorbents. Powdered zeolite dried at 105 to 110° C. are mixed with 8.1% by weight bentonite power and are kneaded with a 4% aqueous urea solution. The mixture is tabletted, dried and calcined at 510° C. The increase in the compressive strength is dictated by the urea content.

JP-A-55 16 5144 discloses kneading zeolite powder for refrigerant aggregates in powder form with bentonite and water, extruding the mixture and forming round particles with a diameter from 0.8 to 10 mm.

According to JP-A-55 10 4913, zeolite in the Na form is mixed with 25% by weight clay, kneaded with water, extruded, calcined at 650° C., immersed in a calcium chloride solution, washed, dried at 110° C. and activated at 400° C. The tablets are used as desiccants.

According to JP-A-603 2572, zeolite powder is mixed with kaolin and Na (or $NH_4$)-hydroxymethyl cellulose, shaped, dried and calcined at 650° C., in order to increase the strength of the zeolite tablets.

According to JP-A-21 44 121, deodorants are prepared by extruding zeolite powders or grains with calcium chloride or bentonite and water. The mixture is then tabletted and the tablets calcined.

According to JP-A-63 218 234, desiccants are produced by extruding a mixture of microporous particles (for example, gypsum, cement, ceramic powder) and an inorganic or organic filler, such as $CaCl_2$, LiCl, bentonite, zeolites, PVA or other water-soluble polymers. The mixture is tabletted and then hardened.

According to JP-A-60 132 643, zeolite tablets are produced as desiccants using 20% sepiolite as the binder. The mixture is kneaded with water, tabletted, dried at 150° C. and calcined at 550° C. The tablets have an improved drying effect compared to bentonite tablets.

The tablets produced according to the prior art are unsuited for use under spatially restricted conditions and under mechanical stress since they are too thick and too heavy and in terms of mass and surface, have overly low sorption capability for toxic gases and vapors. With the processes and mixtures according to the prior art, overly brittle wafers are obtained which crumble especially after calcining.

It is known that electroluminescent devices work properly over a longer time only when a desiccant is present. This can be attributed to the sensitivity of the electrodes, especially of the cathodes, for example, to moisture (the cathodes consist of Ca or Mg alloys). Therefore these devices are sealed as well as possible under a protective gas.

In EP 500 382 A2 the use of a moisture absorber in an electroluminescent device is described. The desiccant in the form of a powder or beads is applied to a black silicone resin coating. According to the preferred embodiment the desiccant is placed in a gas-permeable bag.

U.S. Pat. No. 5,882,761 describes the use of a desiccant in an electroluminescent device. BaO is used as the preferred desiccant. See also U.S. Pat. No. 5,591,379 which discloses a coating for use with microelectronic devices comprising a desiccant powder blended with a binder.

The sorbents known from the aforementioned publications have the disadvantage that they can sorb only water vapor. An attack on the cathode can also be triggered by other gases which, in addition to water, form when the epoxy resin which is used for sealing sets (ammonia, volatile amines). In addition, the action of oxygen also can lead to failure of the luminescent components (oxidation of the cathode).

The object of this invention is to produce disk-shaped wafers based on an inorganic sorbent and an inorganic binder, with a very low thickness (less than 700 microns) which in spite of their low thickness have high strength and thus can be installed, especially in electronic components, in which only limited space is available and which can be exposed to vibrations (for example, electronic display devices in motor vehicles and mobile telephones).

This object is achieved by preparing a disk-shaped wafer based on at least one inorganic sorbent and at least one binder, with a thickness of less than 700 microns, which can be obtained by pressing a mixture of or a mixture containing an inorganic sorbent, about 20 to 60% by weight of the binder and about 10 to 15% by weight water (relative to the overall mixture) at a pressure of at least 70 MPa; and calcining the resulting green wafer at temperatures of at least about 500° C. until the water content is substantially removed.

The wafers as claimed in the invention have high strength, low brittleness, high sorption rate and high sorption capacity at low mass. They exhibit low thermal expansion, no wear and can be easily colored by adding pigments during manufacture.

DETAILED DESCRIPTION

Figure 1:
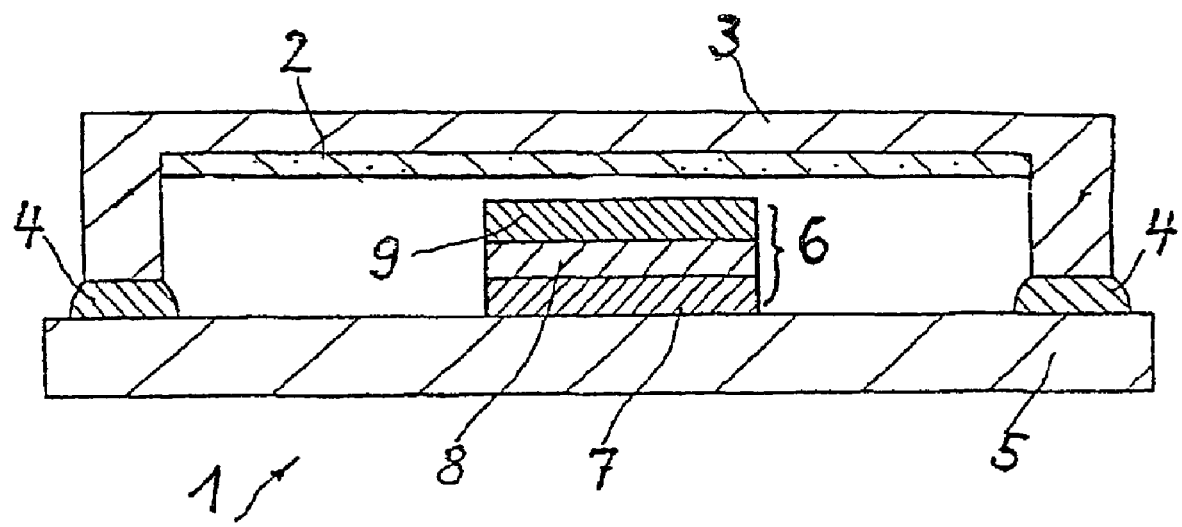
FIG. 1 is a side view of an electroluminescent product containing the plate shaped body of Example 10.

In order to obtain green wafers, as claimed in the invention, of sufficient strength, the adherence to indicated limits for the mixing ratio of the sorbent, binder, and water proportion and the compaction pressure is of extreme importance. In order to study the effect of the mixing ratio of the sorbent and binders on the product properties, it is a good idea to use the weight ratio of the dry sorbent to the dry binder as a parameter to eliminate the different water contents of the various sorbents and binders. Moreover, it is advantageous in the computation or establishment of the water content to consider only the relatively loosely bound proportion which can be determined by heating to 160° C., since only the amount of this water influences the behavior of the mixture in the pressing process and the quality of the final product, not the water which is structurally strongly bound by the sorbent or binder.

To explain this concept the following examples are used. The sorbent zeolite 4A, as a commercially available powder, has a water content of 20% by weight which water can only be completely removed above 500° C. In contrast, the binder bentonite, as a commercially available powder has a water content of 12% by weight which can be completely removed at 160° C. This is common knowledge to one skilled in the art.

If for example 70 parts zeolite 4A, 20 parts bentonite and 10 parts water are mixed, the weight ratio of dry sorbent to dry binder is (0.8*70)/(0.88*20)=3.2

The water content, as can be determined by drying the mixture at 160° C., is composed of the water which was added to the mixture (10 parts), and the water which is loosely bound to the bentonite:

10+(0.12*20)=12.4

This mixture is accordingly determined to contain a weight ratio of the dry sorbent to the dry binder of 3.2 and a water content of 12.4% by weight.

If for example 25 parts zeolite 4A, 60 parts bentonite and 15 parts water are mixed, the weight ratio of dry sorbent to dry binder is (0.8*25)/(0.88*60)=0.4

The water content, as can be determined by drying the mixture at 160° C., is composed of the water which was added to the mixture (15 parts), and the water which is loosely bound to the bentonite:

15+(0.12*60)=22.2

This mixture is accordingly determined to contain a weight ratio of the dry sorbent to the dry binder of 0.4 and a water content of 22.2% by weight.

When the wafers are calcined, besides the water which is loosely bound to the binder and the water which may be strongly bound by the sorbent, the water which is structurally bound to the binder can also be released. When using bentonite as the binder at the calcination temperature, the hydroxyl groups which are bound to the octahedrally coordinated magnesium and aluminum ions are split off as water. The total amount of water released during calcination thus depends on the ratio of the sorbent to the binder, on the nature of the sorbent and the binder, and the amount of water added. For example, in a mixture which is formed from zeolite 4A as the sorbent and bentonite as the binder, the mixing ratio of the dry sorbent to the dry binder is 1.3 and the water content is between 8 and 20% by weight. Between about 20 and 32% by weight is released as water during calcination.

Preferably the wafers are kept at the calcination temperature or another suitable elevated temperature until this amount of water has been released and a constant weight has been achieved. Thus, according to one preferred embodiment of the invention, drying or calcination takes place down to a residual moisture content of <2% by weight (determined at the calcination temperature).

According to one preferred embodiment of the invention it thus relates to disk-shaped wafers containing at least one inorganic sorbent and at least one binder, with a thickness of less than 700 microns, wherein in the mixture the weight ratio of the dry sorbent to the dry binder is between 3.2 and 0.4. Preferably the water content of the mixture, determined at 160° C., is between about 8 and 22% by weight. The wafers can be obtained using a process in which the mixture containing the inorganic sorbent, binder, water and optionally pressing aids, is pressed at a pressure of at least 70 MPa and the resulting green wafers are calcined at temperatures of at least about 500° C. Preferably calcination takes place up to a constant weight or up to a residual moisture content of less than or equal to 2% by weight, determined at the calcination temperature. The preferred mixing ratio of dry sorbent to dry binder is between about 2.1 and 0.7.

The wafers as claimed in the invention can be produced in automated processes in large numbers per unit of time. They can be easily handled and can be removed from a storage container for example using a so-called "pick-and-place" machines and can be inserted into an electronic device.

The wafers as claimed in the invention are able to sorb not only water vapor, but also other gases (ammonia, amines, oxygen). Since they have a high sorption capacity, the electronic device into which they are inserted need not be sealed completely airtight.

Preferably the inorganic sorbent constitutes a natural or artificial zeolite. Other sorbents can also be used, such as amorphous silicic acid or aluminum hydroxide and mixtures of inorganic sorbents.

In principle, any binder which seems suitable to one skilled in the art in this area can be used as the binder. Preferably a smectitic clay, especially bentonite, is used as the binder. Likewise the use of other inorganic binders, for example aluminum oxide hydroxide (pseudoboehmite), is possible. Carbohydrate-based or protein-based organic binders can also be used, for example starch, cellulose derivatives (such as CMC or CEC), casein or also synthetic polymers such as PVA, PVP or polyphenols or tannin-containing binders (quebracho). Mixtures of different binders can also be used.

Surprisingly, adding bentonite to the zeolite does not reduce the sorption capacity of the latter. In fact, a synergistic effect can be established, i.e. the absorption of water vapor by the mixture is reduced far less than could be expected purely according to calculations.

The thickness of the wafer is preferably about 200 to 400 microns, its binder content is preferably about 40 to 50% by weight.

The subject matter of the invention is furthermore a process, especially for producing the above defined wafers, which is characterized in that a mixture containing the inorganic sorbent, about 20 to 60% by weight of the binder, about 10 to 15% by weight of water and 0 to 5% by weight of one or more pressing aids is pressed at a pressure of at least 70 MPa and the resulting green wafer is calcined at temperatures of at least about 500° C. until the water is substantially removed. If the water content of the sorbent or binder used is already sufficient, it is not necessary to add any additional water.

According to one preferred embodiment of the process, the ratio by weight of the dry sorbent and of the dry binder in the mixture is between about 3.2 and 0.4. The water content of the mixture, determined at about 160° C., is preferably between about 8 and 22% by weight.

Preferred process measures are that the mixture is dried preferably to a water content of about 10 to 25% by weight, especially of about 12% by weight, whereupon the dried granulate is crushed, preferably to a particle size of somewhat less than 250 microns.

It was found that when the mixture is pressed into a wafer the best results can be achieved when the mixture contains not more than 15% by weight, preferably not more than 8% by weight, especially 0% by weight of particles larger than 250 microns, preferably >200 microns and especially preferably >150 microns. Moreover, the proportion of particles <45 microns should not be more than 50% by weight, preferably not more than 30% by weight, and especially preferably not more than 20% by weight. The wafers produced in this way have especially advantageous physical and chemical properties.

The preferably used A-zeolite is available in powder form and has a moisture content of about 10 to 22% by weight. The zeolite is mixed with bentonite powder with a moisture content of preferably about 10 to 20, especially about 12% by weight, and with water. This mixture is then granulated.

The water content of the mixture depends on the properties of the bentonites. Enough water should be added to the bentonite/zeolite mixture so that the mixture can be granulated. Preferably a high-efficiency mixer is used for this purpose. The bentonite preferably has a montmorillonite content of >80% by weight.

Preferably a fatty-acid salt of a divalent or trivalent metal, such as calcium or aluminum stearate, is used as the pressing aid.

The preferred pressing pressure is about 100 to 1300 MPa.

The wafers are calcined at about 500 to 900° C., preferably about 650° C., until a constant weight is reached.

The wafers can also be calcined under a vacuum, by which permanent gases such as oxygen are also sorbed.

Furthermore, the wafers can contain dyeing pigments, for example $Fe_3O_4$.

The subject matter of the invention is furthermore the use of the above defined wafers as inserts into electronic devices or components, such as display devices, especially in electroluminescent components, such as organic light-emitting diodes (LED). They can also be used in moisture-sensitive liquid crystal displays (LCD).

These devices or components can also be damaged in their operation by exposure to inorganic or organic gases or vapors during production or use, and as a result of their design have only very little space available for the sorbent.

These electronic devices or components (for example, display devices in motor vehicles and mobile telephones) are often exposed to strong vibrations, for which reason it is important that the wafers do not break or crumble. Due to their strength it is not necessary to cover the wafers with a gas-permeable film, by which the production of electronic components is simplified.

Compared to BaO, the volume and costs of the electronic component can be significantly reduced. Thus, the wafers, relative to mass, have a higher sorption capacity and sorption rate for water vapor in the required temperature and moisture range within an electronic component. Moreover, when using BaO it must be considered that during the hydration reaction the volume of the material increases by 100%. Therefore, within the component, additional volume for the expansion of the desiccant should be provided and between the BaO and the electroluminescent layer a film, which is permeable to water vapor and which prevents contact between the expanding and possibly crumbling desiccant, and the layer should be placed. Conversely, the wafers of the invention do not change volume when water vapor is absorbed and they remain mechanically stable, so that the processes of making available an additional expansion volume within the component and attaching a protective film can be abandoned.

In addition, BaO has the disadvantage that it itself and its hydration products react in a highly basic reaction. Moreover it heats up very dramatically on a local basis when moisture is absorbed and upon direct contact with organic compounds, it tends to self-ignite. This limits the choice of polymers for the aforementioned protective film to very expensive ones, for example fluoropolymers, which thus raises the cost of the component. Moreover, when using BaO, disposal problems arise, since as a chemical which is harmful to health, it makes disassembly, re-use and disposal of individual parts of the electronic component very difficult.

The wafers as claimed in the invention can also be used for other purposes, for example as inserts in pharmaceutical packages, since in this application only a limited volume is available for accommodating a desiccant.

The wafers can be present in any shape, for example, round, square, triangular or rectangular and can also contain holes and/or recesses. The wafers as claimed in the invention are free of dust and resistant to wear. They can be produced in ordinary automatic pressing machines in large numbers per unit of time. Presses with multiple tools are used.

The invention is explained by the following examples.

EXAMPLE 1

Comparison 75.2 kg zeolite 4A (water content 20%), 23.6 kg bentonite (water content 12%) and 1 kg calcium stearate are mixed in an high-efficiency mixer for 2 minutes. Then water is added until the viscosity rises dramatically, and mixing continues for another 4 minutes. The mixture is dried at 110° C. to a water content of 12% and is then granulated (Stokes granulator) and screened (250 microns). 0.22 g of the material with a particle size <250 microns are pressed with a pressure of 69 MPa into a round wafer. The green wafers are calcined at 650° C. for three hours, cooled with the exclusion of moisture, and packaged airtight. The thickness of the wafer decreases by about 15 to 25% during calcination.

Product Properties:

| | |
|---|---|
| Thickness: | 300 +/− 50 microns |
| Moisture content (after calcination): | <1% |
| Scrap in production: | >90% |
| Drop test*: | 100% fracture, wafer crumbles on the edge |

*The so-called drop test is used as a measure for compressive strength, 100 calcined wafers (round wafers with a diameter of 27 mm) being allowed to fall from a height of 1 m with the flat side down. The precentage of broken specimens is ascertained.

EXAMPLE 2

Comparison 57 kg zeolite 4A (water content 20%), 42 kg bentonite (water content 12%) and 1 kg calcium stearate are mixed in an high-efficiency mixer for 2 minutes. Then water is added until the viscosity rises dramatically, and mixing continues for another 4 minutes. The mixture is dried at 110° C. to a water content of 12% and is then granulated (Stokes granulator) and screened (250 microns). 0.22 g of the material with a particle size <250 microns are pressed with a pressure of 69 MPa into a wafer. The green wafers are calcined at 650° C. for three hours, cooled with the exclusion of moisture, and packaged airtight.

Product Properties:

| | |
|---|---|
| Thickness: | 300 +/− 50 microns |
| Moisture content (after calcination): | <1% |
| Scrap in production: | 75% |
| Drop test: | 80% fracture |

EXAMPLE 3

57 kg zeolite 4A (water content 20%), 42 kg bentonite (water content 12%) and 1 kg calcium stearate are mixed in an high-efficiency mixer for 2 minutes. Then water is added until the viscosity rises dramatically, and mixing continues for another 4 minutes. The mixture is dried at 110° C. to a water content of 12% and is then granulated (Stokes granulator) and screened on a 250 micron screen. 0.22 g of the material with a particle size <250 microns are pressed with a pressure of 72 MPa into a wafer. The green wafers are further treated as in Example 2.

Product Properties:

| | |
|---|---|
| Thickness: | 300 +/− 50 microns |
| Moisture content (after calcination): | <1% |
| Scrap in production: | <50% |
| Drop test: | 60% fracture |

EXAMPLE 4

57 kg zeolite 4A (water content 20%), 42 kg bentonite (water content 12%) and 1 kg calcium stearate are mixed in an high-efficiency mixer for 2 minutes. Then water is added until the viscosity rises dramatically, and mixing continues for another 4 minutes. The mixture is dried at 110° C. to a water content of 12%, is then granulated (Stokes granulator) and screened on a 250 micron screen. 0.22 g of the material with a particle size <250 microns are pressed with a pressure of 350 MPa into a wafer. The green wafers are calcined at 650° C. for three hours, cooled with the exclusion of moisture, and packaged airtight.

Product Properties:

| | |
|---|---|
| Thickness: | 300 +/− 50 microns |
| Moisture content (after calcination): | <1% |
| Scrap in production: | <25% |
| Drop test: | 15% fracture |
| Sorption capacity* | |
| after one hour: | 5.4% by weight |
| after 5 hours: | 7.2% by weight |
| after 24 hours: | 13.0% by weight |

*The sorption capacity for water vapor is determined at 25° C. in an atmosphere with 10% humidity.

EXAMPLE 5

The procedure from Example 4 was repeated with the difference that calcination of the green wafers took place in a vacuum. The calcined wafers had essentially the same product properties as the wafers from Example 4, but in addition exhibited an absorption capacity for oxygen of about 5 ml/g (determined in a dry oxygen atmosphere).

EXAMPLE 6

56.9 kg zeolite 4A (water content 20%), 41.5 kg bentonite (water content 12%), 1 kg calcium stearate and 1 kg quebracho are mixed in an high-efficiency mixer for 2 minutes. Then water is added until the viscosity rises dramatically, and mixing continues for another 4 minutes. The mixture is dried at 110° C. to a water content of 12% and is then granulated (Stokes granulator) and screened (250 microns). 0.22 g of the material with a particle size <250 microns are pressed with a pressure of 200 MPa into a wafer. The green wafers are calcined at 650° C. for three hours, cooled with the exclusion of moisture, and packaged airtight.

Product Properties:

| | |
|---|---|
| Thickness: | 300 +/− 50 microns |
| Moisture content (after calcination): | <1% |
| Scrap in production: | <35% |
| Drop test: | 10% fracture |

EXAMPLE 7

The procedure from Example 4 was repeated with the difference that the pressure used in pressing was 1200 MPa. The drop test yielded 10% fracture. Scrap was <10%.

EXAMPLE 8

The procedure from Example 4 was repeated with the difference that 64 kg zeolite 4A, 40 kg bentonite, 5 kg $Fe_3O_4$ and 1 kg calcium stearate were used. The resulting wafers were dark colored and could be used in a LED display as a contrast surface.

EXAMPLE 9

57 kg zeolite 4A (water content 20%), 42 kg of a 50/50 mixture of attapulgite and kaolin (water content 12%) and 1 kg calcium stearate are mixed in an high-efficiency mixer for 2 minutes. Then water is added until the viscosity rises dramatically, and mixing continues for another 4 minutes. The mixture is dried to a water content of 12%, is then granulated and screened on a 150 micron screen. 0.17 g of the material with a particle size <150 microns are pressed with a pressure of 200 MPa into a wafer. The green wafers are calcined at 650° C. for three hours, cooled with the exclusion of moisture, and packaged airtight.

Product Properties:

| | |
|---|---|
| Thickness: | 300 +/− 50 microns |
| Moisture content (after calcination): | <1% |

-continued

| | |
|---|---|
| Scrap in production: | 25% |
| Drop test: | 70% fracture |

EXAMPLE 10

An organic electroluminescent component 1 (square, surface 12.9 cm²), as shown in FIG. 1, is produced using a wafer (round, diameter 27 mm) from Example 4. After the wafer 2 is mounted on the back wall 3 of the component, it is attached using an adhesive 4 to the glass substrate 5 of the component and sealed as much as possible using the adhesive. Then a microscopic photograph (magnification 50×) of the light emitting part 6 (consisting of the anode 7, the light emitting layer 8 and the cathode 9) of the component is taken. This photograph [not included] does not show any dark (non-luminous) specks which would indicate an attack on the cathode 9.

The component is exposed to a temperature of 85° C. and a relative humidity of 85% for 500 h. Then a microscopic photograph of the light emitting part 6 of the component 1 is taken again. Comparison of the two photographs [not included] shows that no dark specks formed which would indicate an attack on the cathode 9.

EXAMPLE 11

Comparison

An organic electroluminescent component 1 as in Example 9 as shown in FIG. 1 is produced using BaO. The covering for the BaO is a water-permeable teflon film which is attached to the rear wall 3 of the component using thin, two-sided adhesive tape. The amount of BaO is set such that the total mass of the BaO, the teflon film and the double-sided adhesive tape corresponds exactly to that of the wafer used in Example 9. Then, as described in Example 9, magnified photographs of the light emitting part before and after storage for 500 h at 85° C. and 85% humidity are taken [not included]. Comparison of the two photographs shows the distinctly recognizable growth of dark points which indicate an attack on the cathode 9.

The invention claimed is:

1. A disk-shaped wafer which is obtained by a process comprising the steps of
    compressing a mixture, comprised of an inorganic sorbent, about 20 to about 60 percent on a dry weight basis of a binder and about 10 to about 15 percent by weight water, wherein the quantity of the water is based on its overall content in the mixture at a pressure of at least 70 MPa to form a green wafer, and
    calcining the resulting green wafer at a temperature of at least about 500° C. until the water present in the calcined wafer comprises less than about 2 percent of the calcined wafer, by weight, wherein the thickness of the calcined wafer is less than about 700 microns.

2. The disk-shaped wafer of claim 1 wherein the weight ratio of the sorbent to the binder on a dry weight basis in the mixture is from about 3.2:1 to about 0.4:1.

3. The disk-shaped wafer of claim 1 wherein the green wafer is calcined until the wafer has a substantially constant weight.

4. The disk-shaped wafer of claim 1 wherein the inorganic sorbent comprises a natural or synthetic zeolite or mixtures thereof.

5. The disk-shaped wafer of claim 1 wherein the binder comprises a smectite clay.

6. The disk-shaped wafer of claim 1 wherein the binder comprises bentonite.

7. The disk-shaped wafer of claim 1 wherein the thickness of the calcined wafer is from about 200 to about 400 microns.

8. The disk-shaped wafer of claim 1 wherein the binder comprises from about 40 to about 50 percent by weight of the mixture prior to compressing.

9. The disk-shaped wafer of claim 1 wherein the pressure placed on the mixture is from about 100 to about 1300 MPa.

10. The disk-shaped wafer of claim 1 wherein the mixture further comprises a pressing aid.

11. The disk-shaped wafer of claim 10 wherein the pressing aid comprises a fatty acid salt of a divalent or trivalent metal.

12. The disk-shaped wafer of claim 1 wherein the binder comprises a tannin-containing binder.

13. The disk-shaped wafer of claim 1 wherein the binder comprises quebracho.

14. The disk-shaped wafer of claim 1 wherein the green wafer is calcined substantially under a vacuum.

15. The disk-shaped wafer of claim 1 wherein the mixture further comprises a dyeing pigment.

16. The disk-shaped wafer of claim 1 wherein the water content of the mixture determined at a 160° C. prior to compressing is from about 12 to about 22 percent by weight.

17. The disk-shaped wafer of claim 1 wherein the water content of the mixture determined at a 160° C. prior to compressing is from about 8 to about 22 percent by weight.

18. A process for producing a disk-shaped wafer comprising preparing a mixture containing at least one inorganic sorbent, about 20 to 60 percent by weight of at least one binder and about 10 to about 15 percent by weight water,
    compressing the mixture at a pressure at least 70 MPa to produce a green wafer, and
    calcining the green wafer at a temperature of at least about 500° C. until the water content of the resulting disk-shaped wafer is less than about 2 percent by weight and its thickness is less than 700 microns.

19. The process of claim 18 wherein the weight ratio of the sorbent to the binder in the mixture on a dry weight basis is from about 3.2:1 to about 0.4:1.

20. The process of claim 18 wherein the calcination step is continued until the green wafer has a substantially constant weight.

21. The process of claim 18 wherein the water content of the mixture determined at 160° C. prior to compressing is from about 12 to about 22 percent by weight.

22. The process of claim 18 wherein the water content of the mixture determined at 160° C. prior to compressing is from about 8 to about 22 percent by weight.

23. A process for sorbing inorganic and organic gases or vapors from an electroluminescent device comprising placing the calcined, disk-shaped wafer of claim 1 within the electroluminescent device and closing the electroluminescent device.

* * * * *